United States Patent
Lee et al.

(10) Patent No.: US 10,770,396 B2
(45) Date of Patent: Sep. 8, 2020

(54) SEMICONDUCTOR STRUCTURE AND METHOD FOR FABRICATING THE SAME

(71) Applicant: Vanguard International Semiconductor Corporation, Hsinchu (TW)

(72) Inventors: Fang-Ming Lee, Hsinchu (TW); Sheng-Wei Fu, Taoyuan (TW); Chung-Yeh Lee, Sinpu Township (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/235,013

(22) Filed: Dec. 28, 2018

(65) Prior Publication Data

US 2020/0211964 A1 Jul. 2, 2020

(51) Int. Cl.
  *H01L 29/78* (2006.01)
  *H01L 21/768* (2006.01)
  *H01L 23/535* (2006.01)
  *H01L 29/66* (2006.01)

(52) U.S. Cl.
  CPC ...... *H01L 23/535* (2013.01); *H01L 21/76847* (2013.01); *H01L 29/66681* (2013.01); *H01L 29/7816* (2013.01)

(58) Field of Classification Search
  CPC .................. H01L 29/7816; H01L 29/66681
  USPC .......................................................... 257/330
  See application file for complete search history.

(56) References Cited

U.S. PATENT DOCUMENTS

| | | | |
|---|---|---|---|
| 7,952,145 B2* | 5/2011 | Korec | H01L 29/41766 257/343 |
| 2001/0021559 A1 | 9/2001 | Norstrom et al. | |
| 2009/0065814 A1* | 3/2009 | Bhalla | H01L 29/1083 257/230 |
| 2012/0037983 A1 | 2/2012 | Hshieh | |
| 2015/0145025 A1* | 5/2015 | Yoshida | H01L 29/7813 257/329 |
| 2016/0181091 A1* | 6/2016 | Niyogi | H01L 29/516 438/584 |
| 2016/0211348 A1* | 7/2016 | Yoshida | H01L 27/088 |
| 2018/0061660 A1* | 3/2018 | Joshi | H01L 21/32134 |
| 2018/0090490 A1* | 3/2018 | Lin | H01L 29/7831 |

(Continued)

FOREIGN PATENT DOCUMENTS

TW 200931663 A 7/2009
TW I587488 B 6/2017

(Continued)

OTHER PUBLICATIONS

Taiwanese Office Action and Search Report, dated Oct. 30, 2019, for Taiwanese Application No. 107137350.

(Continued)

*Primary Examiner* — David Vu
*Assistant Examiner* — Brandon C Fox
(74) *Attorney, Agent, or Firm* — Birch, Stewart, Kolasch & Birch, LLP

(57) ABSTRACT

A semiconductor structure includes a substrate, an epitaxial layer disposed on the substrate, a conductive feature disposed in the epitaxial layer having a protruding portion that is higher than the epitaxial layer, and a diffusion barrier layer disposed on sidewalls of the conductive feature.

18 Claims, 15 Drawing Sheets

(56) References Cited

U.S. PATENT DOCUMENTS

2018/0308797 A1\* 10/2018 Tsai .................... H01L 29/7851
2019/0006233 A1\* 1/2019 Chang ................. H01L 21/0217

FOREIGN PATENT DOCUMENTS

TW         201816860 A    5/2018
TW         201828478 A    8/2018

OTHER PUBLICATIONS

Taiwanese Office Action and Search Report for Taiwanese Application No. 107137350, dated May 25, 2020.

\* cited by examiner

SEMICONDUCTOR STRUCTURE AND METHOD FOR FABRICATING THE SAME

BACKGROUND

Technical Field

The disclosure relates to semiconductor technologies, and more particularly to a semiconductor device having a conductive feature and a method for manufacturing the same.

Description of the Related Art

Since laterally diffused metal oxide semiconductors (LDMOSs) have high operating efficiency and good gain characteristics and are easy to integrate with other circuitry, the LDMOS has become a semiconductor component that is often used in various electronic products.

However, since the LDMOS has a conductive feature connected to a source electrode and a conductive terminal of a substrate, the dopants of the conductive feature often diffuse to peripheral elements during subsequent processes (e.g. a high-temperature thermal process) to negatively affect the electrical properties of the LDMOS. In addition, when the size of an LDMOS is reduced, the impact of dopant diffusion from the conductive feature is more significant. Thus, the scaling down of the LDMOS is limited and the source-drain resistance ($R_{DSON}$) cannot be reduced to enhance the performance of the LDMOS any further.

While existing LDMOSs have been generally adequate for their intended purposes, there are still many problems. Thus, how to improve the existing LDMOS has become one of the topics that the industry has paid much attention to.

SUMMARY

In some embodiments of the present disclosure, a semiconductor structure is provided. The semiconductor structure comprises a substrate, an epitaxial layer disposed on the substrate, a conductive feature disposed in the epitaxial layer and having a protruding portion that is higher than the epitaxial layer, and a diffusion barrier layer disposed on sidewalls of the conductive feature. In one embodiment, the width of the protruding portion is greater than the width of the conductive feature in the epitaxial layer. In one embodiment, the protruding portion covers the top surface of the diffusion barrier layer. In one embodiment, the diffusion barrier layer includes one or more dielectric barrier layers. In one embodiment, the diffusion barrier layer includes a barrier oxide layer and a barrier nitride layer on the barrier oxide layer.

In one embodiment, the semiconductor structure further includes a drain region disposed in the epitaxial layer, wherein the diffusion barrier layer contacts the drain region and separates the drain region from the conductive feature. In one embodiment, the conductive feature is disposed between two laterally diffused metal oxide semiconductors (LDMOSs) and the conductive feature penetrates a common source region of the LDMOSs.

In some embodiments of the present disclosure, a method for fabricating a semiconductor structure is provided, wherein the method includes providing a substrate; forming an epitaxial layer on the substrate; forming a mask structure on the epitaxial layer, and the mask structure has an opening exposing a portion of the epitaxial layer; using the mask structure as an etching mask to remove the exposed portion of the epitaxial layer to form a trench; forming a diffusion barrier layer on sidewalls of the trench; forming a conductive feature in the trench, and the conductive feature has a protruding portion that is higher than the epitaxial layer; and removing the mask structure.

In one embodiment, the width of the protruding portion is greater than the width of the conductive feature in the trench. In one embodiment, the protruding portion covers the top surface of the diffusion barrier layer. In one embodiment, the mask structure includes one or more dielectric layers. In one embodiment, the mask structure includes a first oxide layer and a nitride layer formed on the first oxide layer. In one embodiment, the mask structure further includes a second oxide layer formed on the nitride layer. In one embodiment, the mask structure includes multiple dielectric layers, and removing the mask structure includes: removing a portion of the mask structure without removing the layer of the multiple dielectric layers which is closest to the epitaxial layer; and removing the remaining portions of the mask structure after removing the portion of the mask structure.

In one embodiment, the diffusion barrier layer includes one or more dielectric barrier layers. In one embodiment, the diffusion barrier layer includes a barrier oxide layer and a barrier nitride layer formed on the barrier oxide layer. In one embodiment, the method further includes forming a drain region in the epitaxial layer, wherein the diffusion barrier layer contacts the drain region and separates the drain region from the conductive feature. In one embodiment, the conductive feature is disposed between two laterally diffused metal oxide semiconductors (LDMOSs) and the conductive feature penetrates a common source region of the LDMOSs.

BRIEF DESCRIPTION OF THE DRAWINGS

Aspects of this disclosure are best understood from the following detailed description when read with the accompanying figures. It should be noted that, in accordance with common practice in the industry, various features are not drawn to scale. In fact, the dimensions of the various features may be arbitrarily increased or reduced for clarity of discussion.

FIGS. 8-10 are cross-sectional views illustrating various steps in the removal of a mask structure according to some embodiments of the present disclosure.

FIGS. 11-13 are cross-sectional views illustrating various steps in the removal of a mask structure according to other embodiments of the present disclosure.

DETAILED DESCRIPTION

Figure 1:
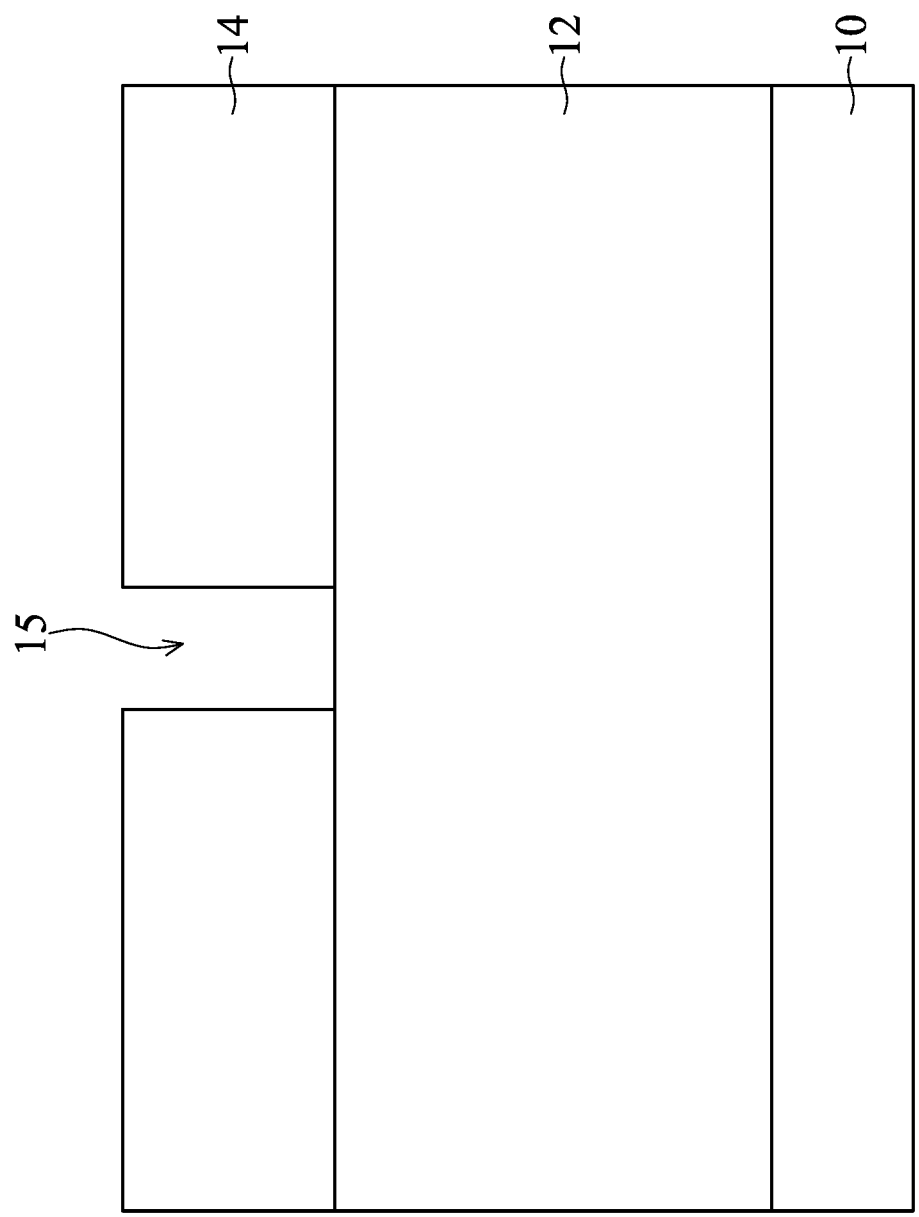
FIGS. 1-15 are cross-sectional views illustrating various steps in the formation of a semiconductor structure according to some embodiments of the present disclosure.

The following disclosure provides many different embodiments, or examples, for implementing different features of the subject matter provided. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "over", "below," "lower," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented and the spatially relative descriptors used herein may likewise be interpreted accordingly.

Figure 14:
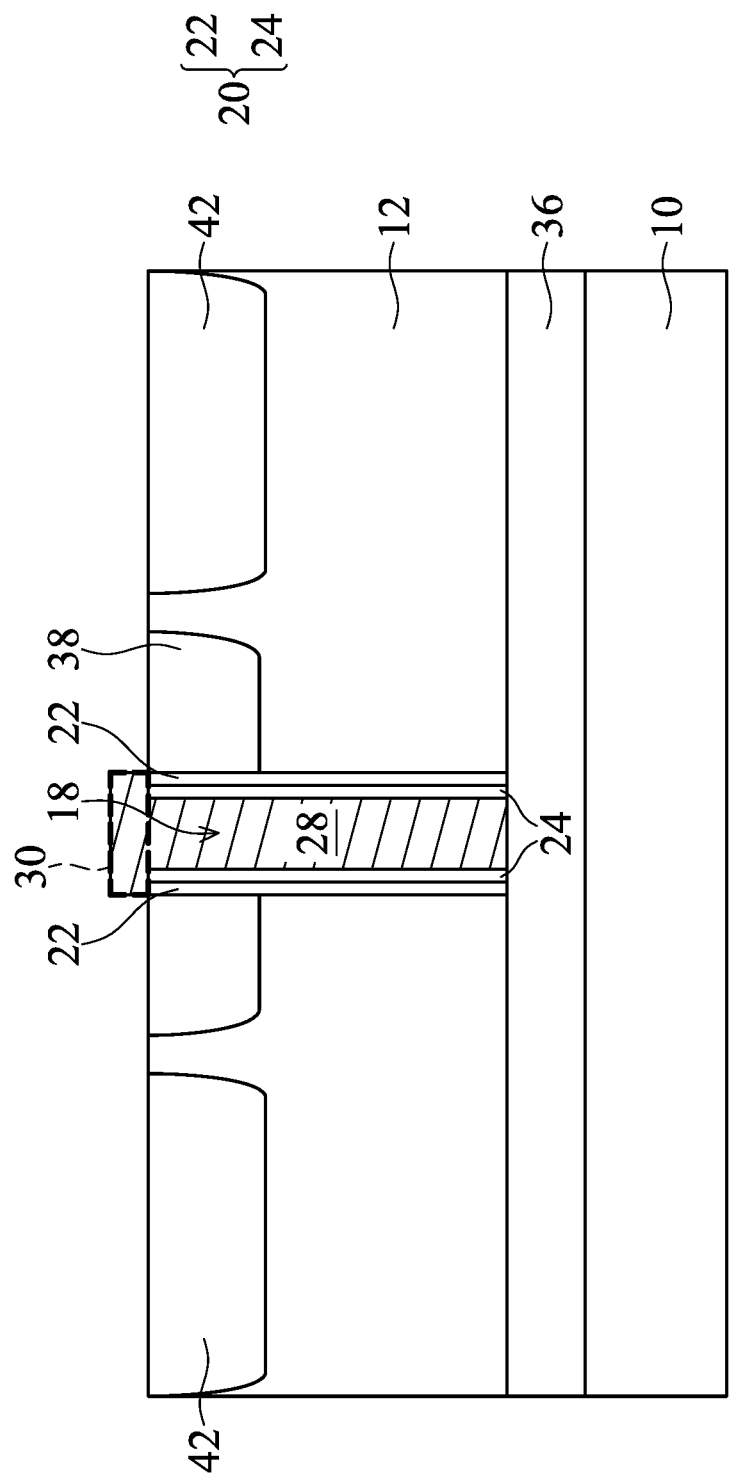
Figure 15:
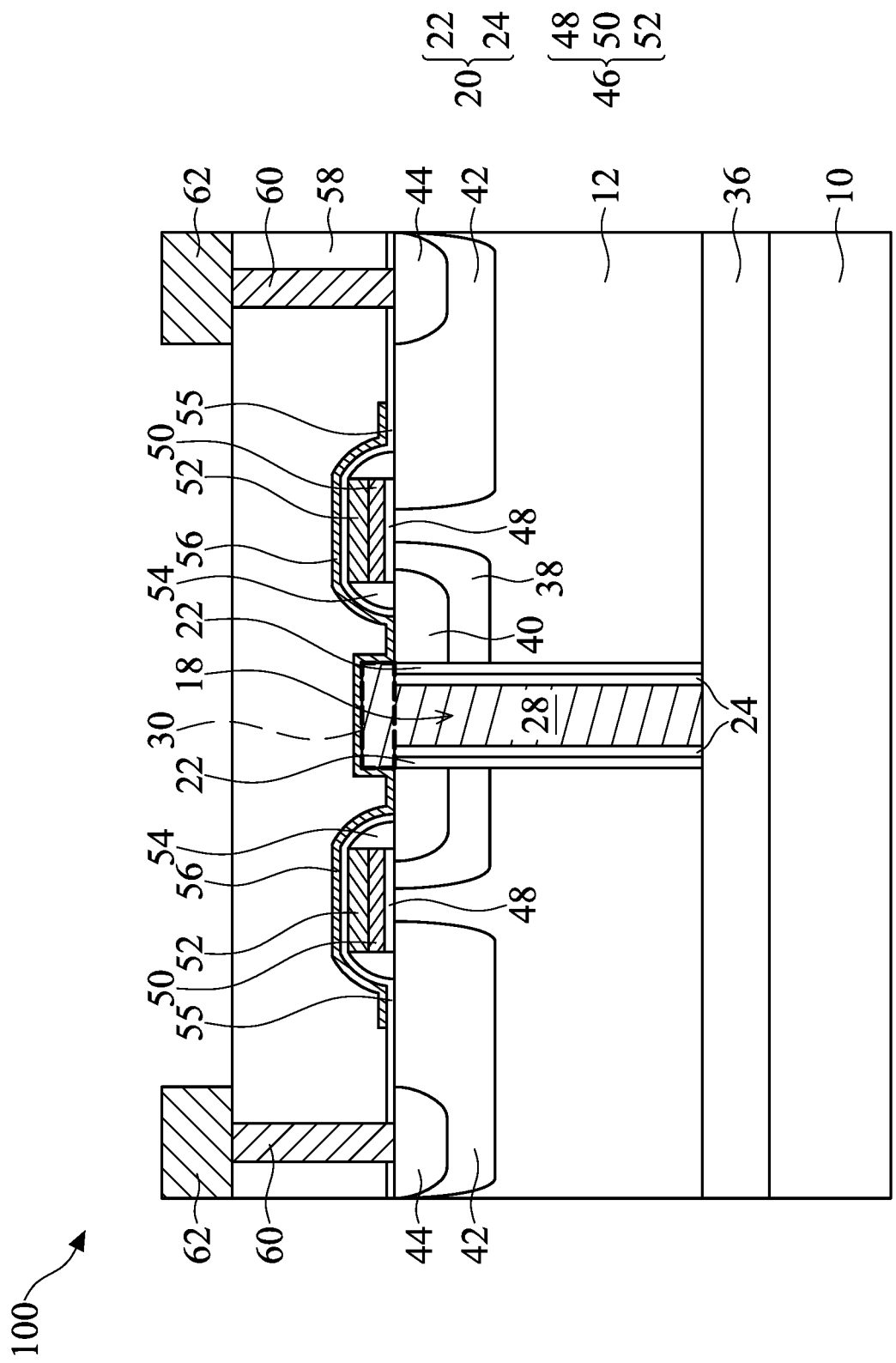

FIGS. 1-7 and 14-15 are schematic views illustrating various steps in the formation of a semiconductor structure 100 shown in FIG. 15 according to some embodiments of the present disclosure. Referring to FIG. 1, a substrate 10 is provided in the present disclosure. The substrate 10 may include silicon or alternatively the substrate 10 may include other elemental semiconductor materials, such as germanium. In some embodiments, the substrate 10 may include a compound semiconductor, such as silicon carbide, gallium nitride, gallium arsenide, indium arsenide, or indium phosphide. In some embodiments, the substrate 10 is made of an alloy semiconductor, such as SiGe, SiGeC, GaAsP, or GaInP. In the present embodiment, the substrate 10 may be a P-type substrate. In some embodiments, the substrate 10 includes dopants, and the dopants may be made of, or include, boron, gallium, indium, aluminum, or a combination thereof.

Subsequently, an epitaxial layer 12 is formed on the substrate 10. In some embodiments, the formation of the epitaxial layer 12 includes performing an epitaxial growth process to form the epitaxial layer 12 on the substrate 10. In the present embodiment, the epitaxial layer 12 may be P-type. In some embodiments, the epitaxial growth process may be such as a metal organic chemical vapor deposition (MOCVD), a plasma-enhanced chemical vapor deposition (PECVD), a molecular beam epitaxy (MBE), a hydride vapor phase epitaxy (HVPE), a liquid phase epitaxy (LPE), a chloride vapor phase epitaxy (Cl-VPE).

Subsequently, a mask structure 14 is formed on the epitaxial layer 12. The mask structure 14 has an opening 15 exposing a portion of the epitaxial layer 12. In some embodiments, the mask structure 14 includes one or more dielectric layers. In this embodiment, the mask structure 14 is a first oxide layer. The thickness of the first oxide layer is in a range from about 2000 angstroms (Å) to about 5000 Å. The material of the first oxide layer may be made of, or include, silicon dioxide or another suitable oxides. For example, thermal oxidation, chemical vapor deposition (CVD), atomic layer deposition (ALD), or other similar processes may be used to form the first oxide layer. In some embodiments, the formation of the mask structure 14 includes forming a mask material on the epitaxial layer 12 and then patterning the mask material to form the mask structure 14.

Figure 2:
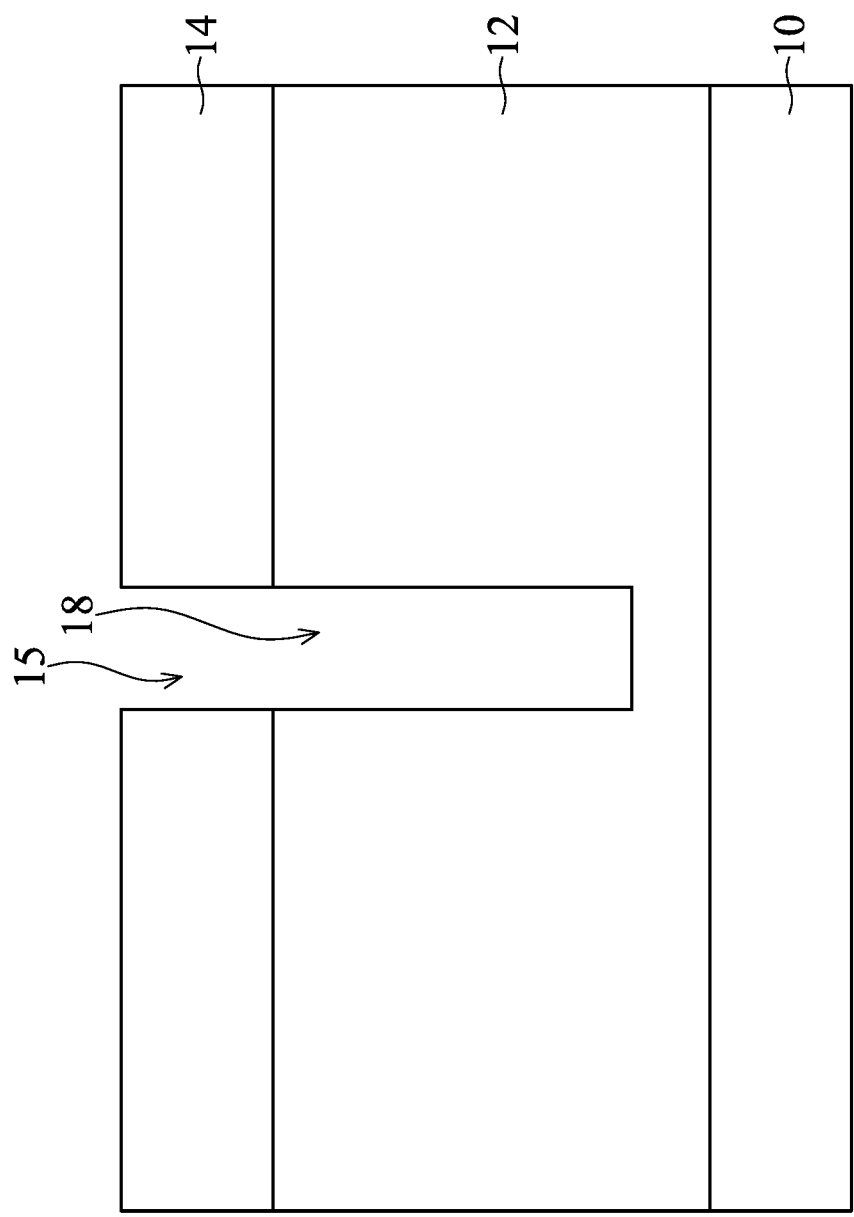

Referring to FIG. 2, the mask structure 14 is used as an etching mask to remove the exposed epitaxial layer 12 through the opening 15 to form a trench 18. For example, the depth of the trench 18 may be in a range from about 1.5 micrometers (um) to about 1.9 um. Steps for removing the exposed epitaxial layer 12 may include using a dry etching, a wet etching, or a combination thereof to perform an etching process. A wet etching may include dipping etching, spray etching, a combination thereof, or other suitable processes. Dry etching may include capacitively coupled plasma etching, inductively coupled plasma etching, electron cyclotron resonance plasma etching, a combination thereof, or other suitable processes. The etching processes may be performed for a period of time and then stopped before penetrating the epitaxial layer 12. Thus, the trench 18 exposes the epitaxial layer 12 but does not expose the substrate 10.

Furthermore, when removing the exposed epitaxial layer 12 to form the trench 18, the first oxide layer used as the etching mask is also partially consumed and thus becomes thinner. In some embodiments, before removing the exposed epitaxial layer 12 to form the trench 18, the thickness of the first oxide layer (e.g. the first oxide layer shown in FIG. 1) is in a range from about 2000 Å to about 5000 Å. In the step of etching a portion of the epitaxial layer 12 to form the trench 18 within the range of the thickness of the first oxide layer described above, the thickness of the first oxide layer is sufficient to protect components under the first oxide layer from damage, and a portion of the first oxide layer remains after forming the trench 18. The thickness of the remaining first oxide layer is in a range from about 1500 Å to about 2500 Å after forming the trench 18.

Figure 3:
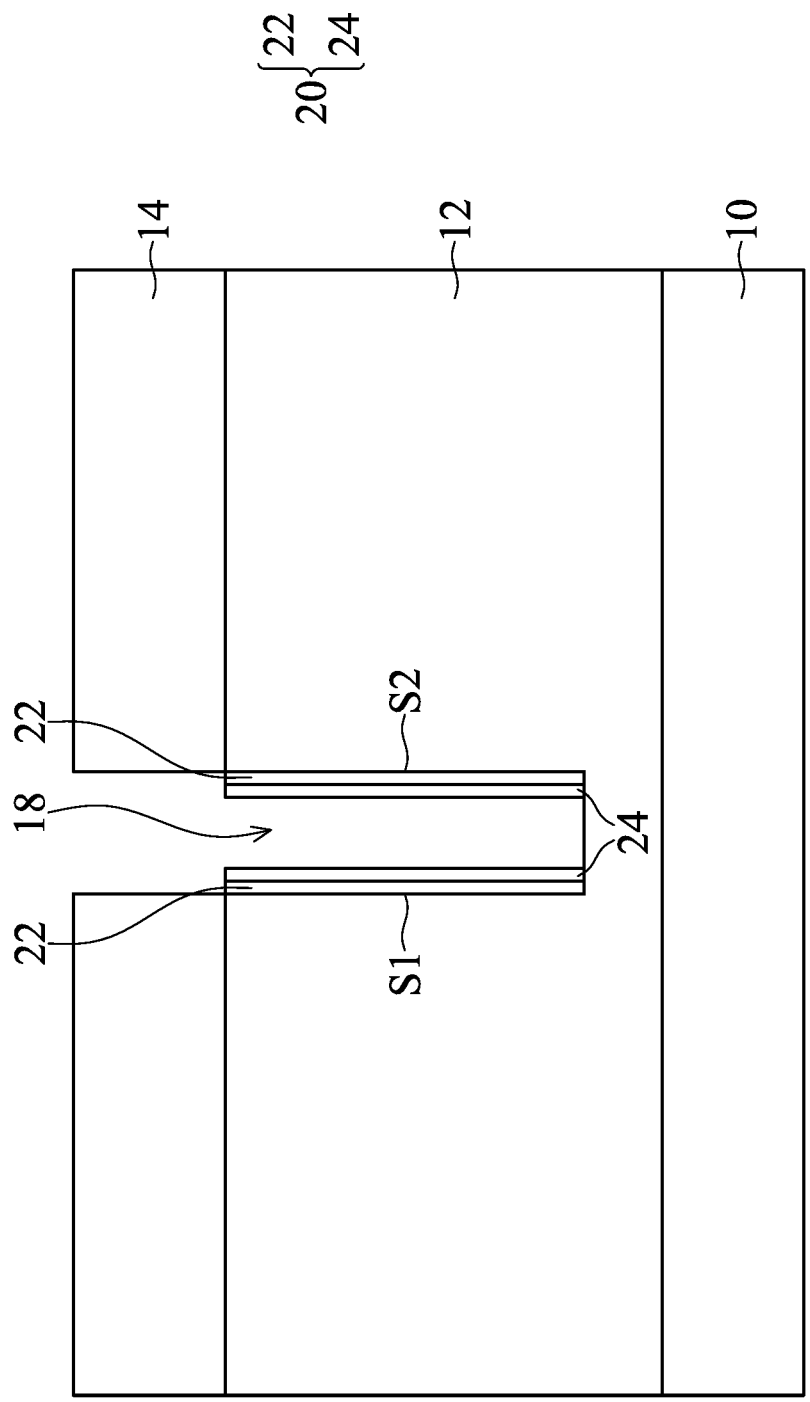

Referring to FIG. 3, a diffusion barrier layer 20 is formed on sidewalls S1, S2 of the trench 18. In some embodiments, the diffusion barrier layer 20 includes one or more dielectric barrier layers. In the present embodiment, the diffusion barrier layer 20 includes a barrier oxide layer 22 directly formed on the sidewalls S1, S2 and a barrier nitride layer 24 formed on the barrier oxide layer 22. By disposing the barrier oxide layer 22 between the barrier nitride layer 24 and the epitaxial layer 12, the problem of excessive stress arising from the direct contact between the barrier nitride layer 24 and the epitaxial layer 12 can be solved. In some embodiments, the barrier oxide layer 22 may be made of, or include, silicon dioxide or other suitable oxides. The barrier nitride layer 24 may be made of, or include, silicon nitride or other suitable nitrides.

In some embodiments shown in FIG. 3, the thickness of the barrier oxide layer 22 is in a range from about 70 Å to about 120 Å, and the thickness of the barrier nitride layer 24 is in a range from about 140 Å to about 190 Å. In some other embodiments, the diffusion barrier layer 20 may be a single barrier oxide layer 22. The thickness of the single barrier oxide layer 22 is in a range from about 200 Å to about 300 Å.

Figure 4:
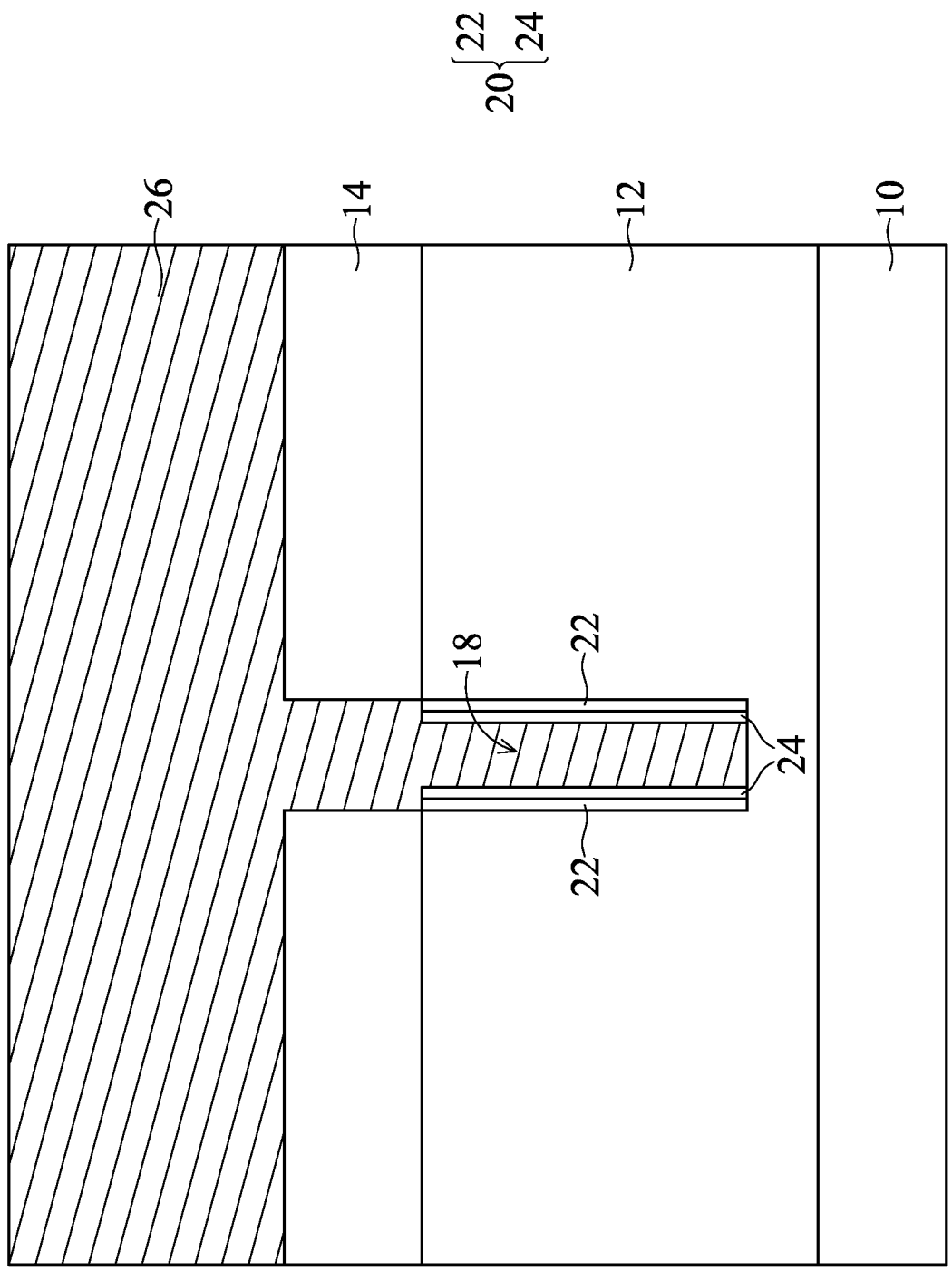
Figure 5:
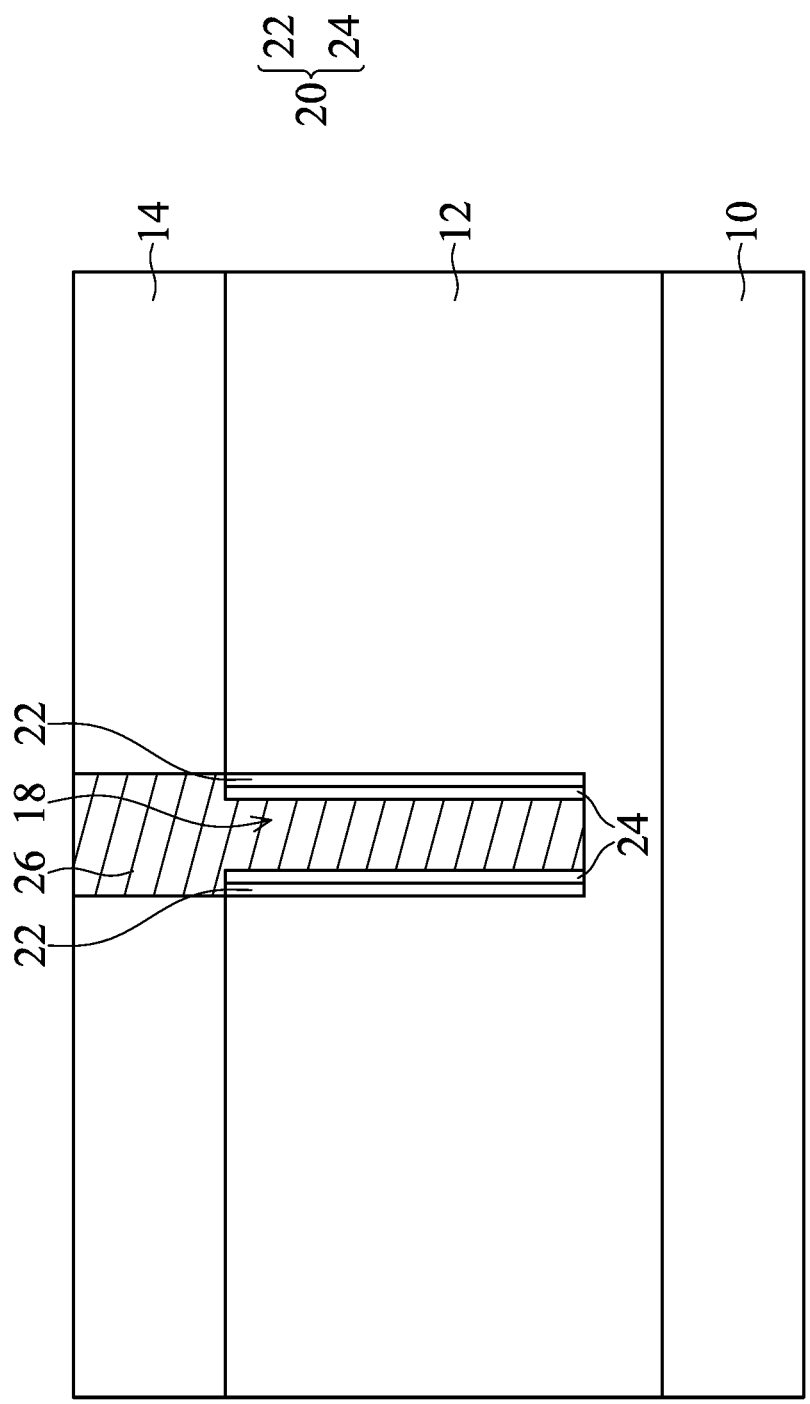

Referring to FIG. 4, after forming the diffusion barrier layer 20, a conductive material 26 is formed on the epitaxial layer 12 covering the trench 18 and the surface of the mask structure 14. Referring to FIG. 5, a planarization process is performed on the conductive material 26 subsequently to expose the upper surface of the mask structure 14. For example, the planarization process may be a chemical mechanical polishing (CMP) process.

Figure 6:
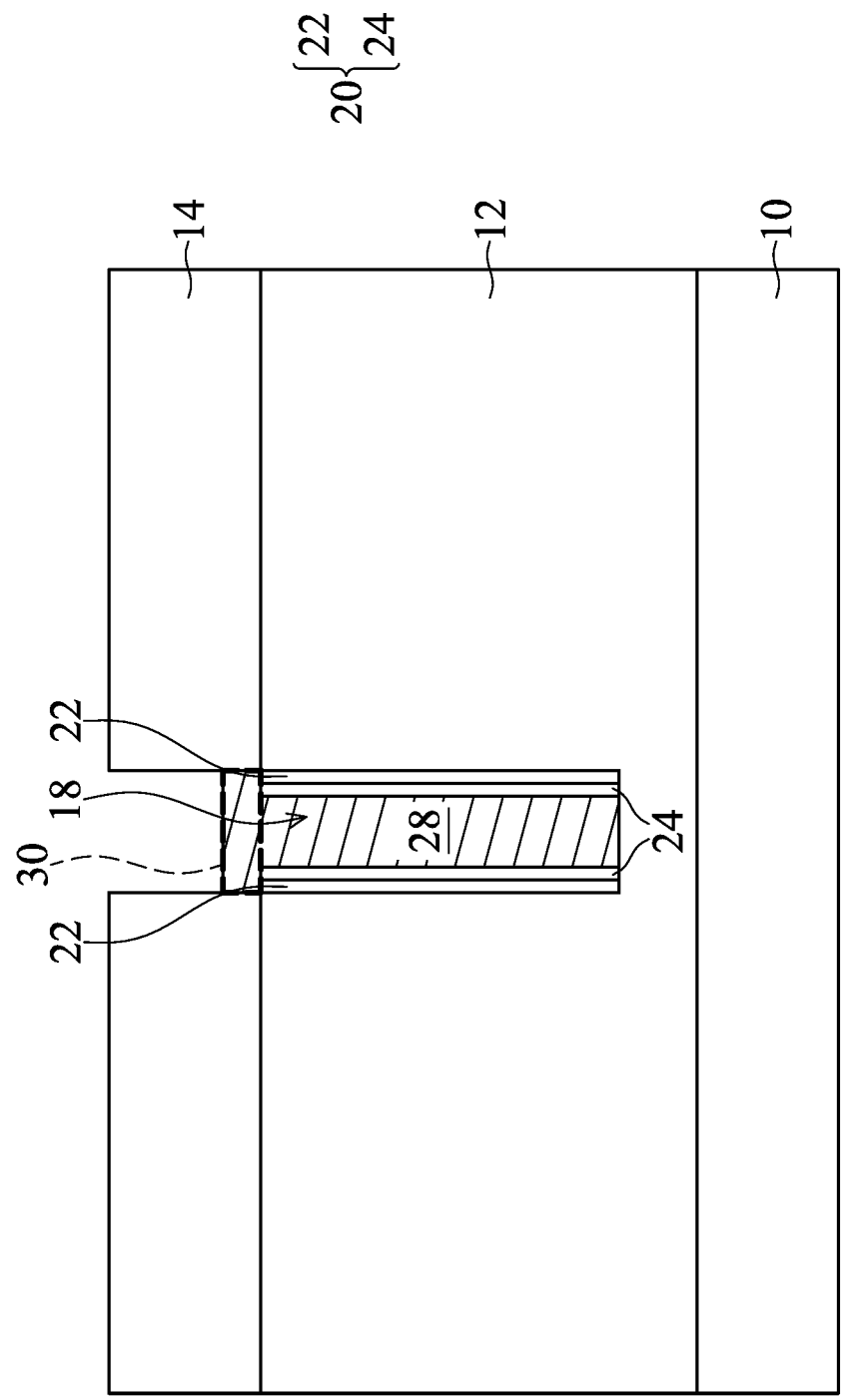

Referring to FIG. 6, an etching process is subsequently performed on the conductive material 26. The upper surface of the conductive material 26 is etched until it is lower than the upper surface of the mask structure 14 but higher than the upper surface of the epitaxial layer 12 to form a conductive feature 28 in the trench 18, and the conductive feature 28 has a protruding portion 30 higher than the epitaxial layer 12. In some embodiments, the width of the protruding portion 30 is greater than the width of the conductive feature 28 in the trench. In some embodiments, as shown in FIG. 6, the protruding portion 30 covers the top surface of the diffusion barrier layer 20.

It should be noted that the conductive feature 28 formed in the trench 18 is prone to forming a seam. When the height of the top surface of the conductive feature 28 is lower than or the same as the height of the top surface of the epitaxial layer 12, the seam will penetrate the top surface of the conductive feature 28 which causes erosion in subsequent cleaning steps, and leads to short-circuits and other problems in the subsequently formed circuitry. Thus, the conductive feature 28 with a protruding portion 30 that is higher than the epitaxial layer 12 in the present disclosure can prevent the seam in the conductive feature 28 from penetrating the top surface of the conductive feature 28 and further prevent problems from arising in the subsequent manufacturing processes. In an embodiment, the height of the protruding portion 30 is in a range from 200 Å to 800 Å.

Furthermore, the conductive feature 28 may be a P-type conductive feature. In some embodiments, the conductive feature 28 includes dopants. The dopants may be made of, or include, boron, gallium, indium, aluminum, or a combination thereof. It should be noted that since the diffusion barrier layer 20 provided in the present disclosure is disposed between the conductive feature 28 and the epitaxial layer 12, the diffusion barrier layer 20 can block the dopant diffusion from the conductive feature 28 to the periphery during subsequent processes (e.g. a high-temperature thermal process) and further prevent the electrical properties of peripheral elements from being impacted.

Furthermore, in general, when the size of the formed semiconductor structure 100 in FIG. 15 is reduced, the diffusion of the dopants of the conductive feature 28 impacts the peripheral elements more significantly. However, since the diffusion barrier layer 20 provided in the present disclosure is disposed between the conductive feature 28 and the epitaxial layer 12, the dopants of the conductive feature 28 do not impact the peripheral elements even though the size of the semiconductor structure 100 is reduced. Thus, the size of the semiconductor structure 100 is not limited and it can be reduced further to reduce the source-drain resistance ($R_{DSON}$) and enhance the performance of the semiconductor structure 100.

In some embodiments, a bottom surface of the trench 18 may be a planar bottom surface or a U-shaped bottom surface. When the bottom surface of the trench 18 is a U-shaped bottom surface, an area of a direct contact between the conductive feature 28 and the epitaxial layer 12 can be increased to enlarge a flux of operating current to enhance the performance of the semiconductor structure 100 formed in subsequent processes.

Figure 7:
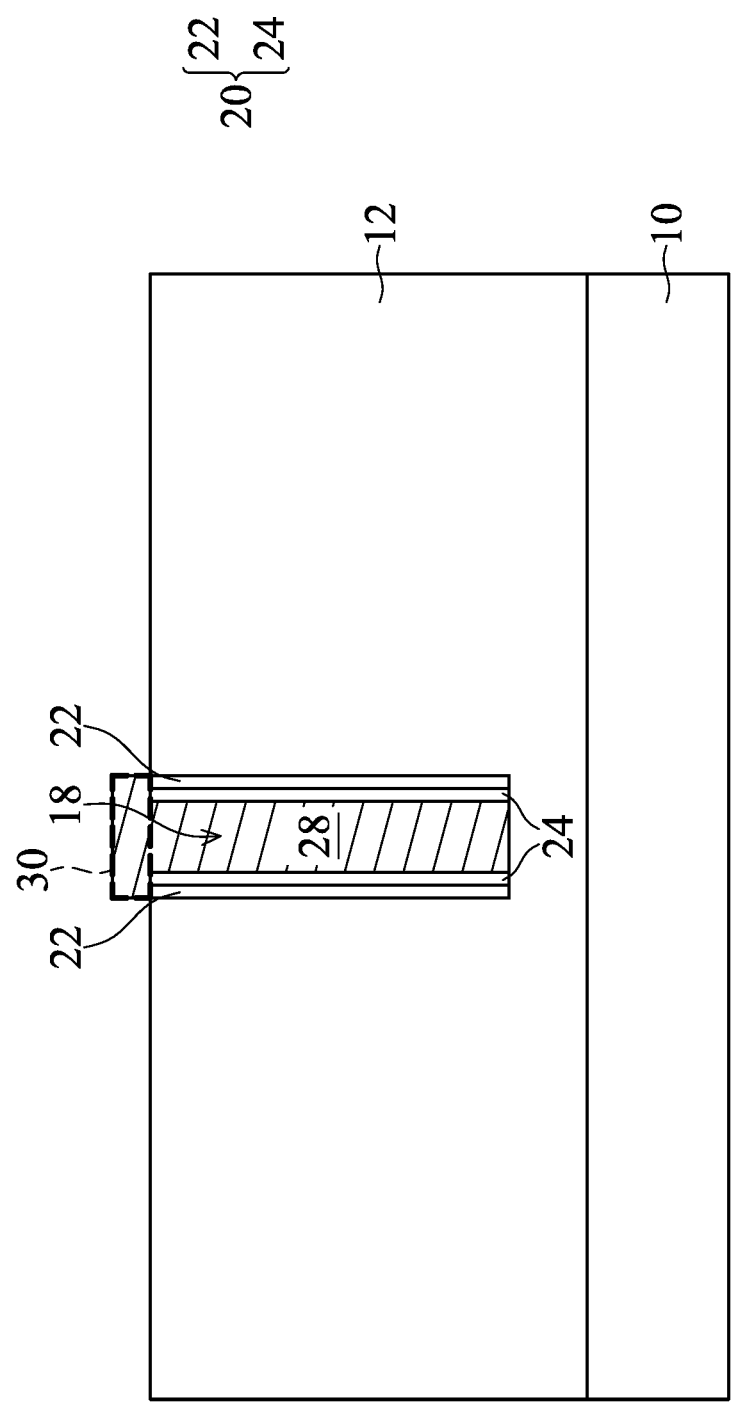

Referring to FIG. 7, the mask structure 14 is removed. The removal of the mask structure 14 includes using hot phosphoric acid, hydrofluoric acid, or a combination thereof to remove the mask structure 14. In the present embodiment, the mask structure 14 is a single layer of the first oxide layer. The step of removing the first oxide layer may include using hydrofluoric acid to remove the first oxide layer.

Figure 8:
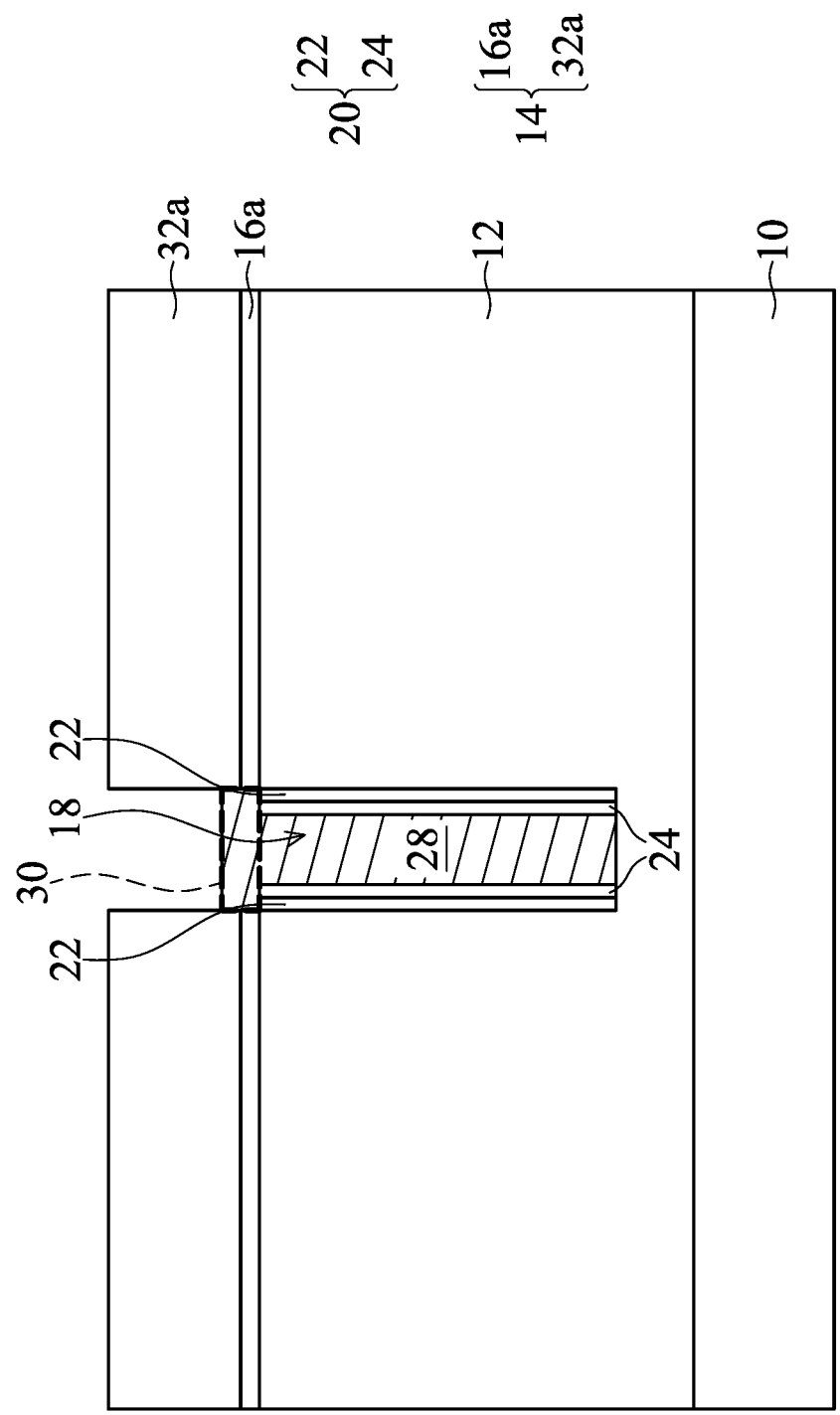
Figure 9:
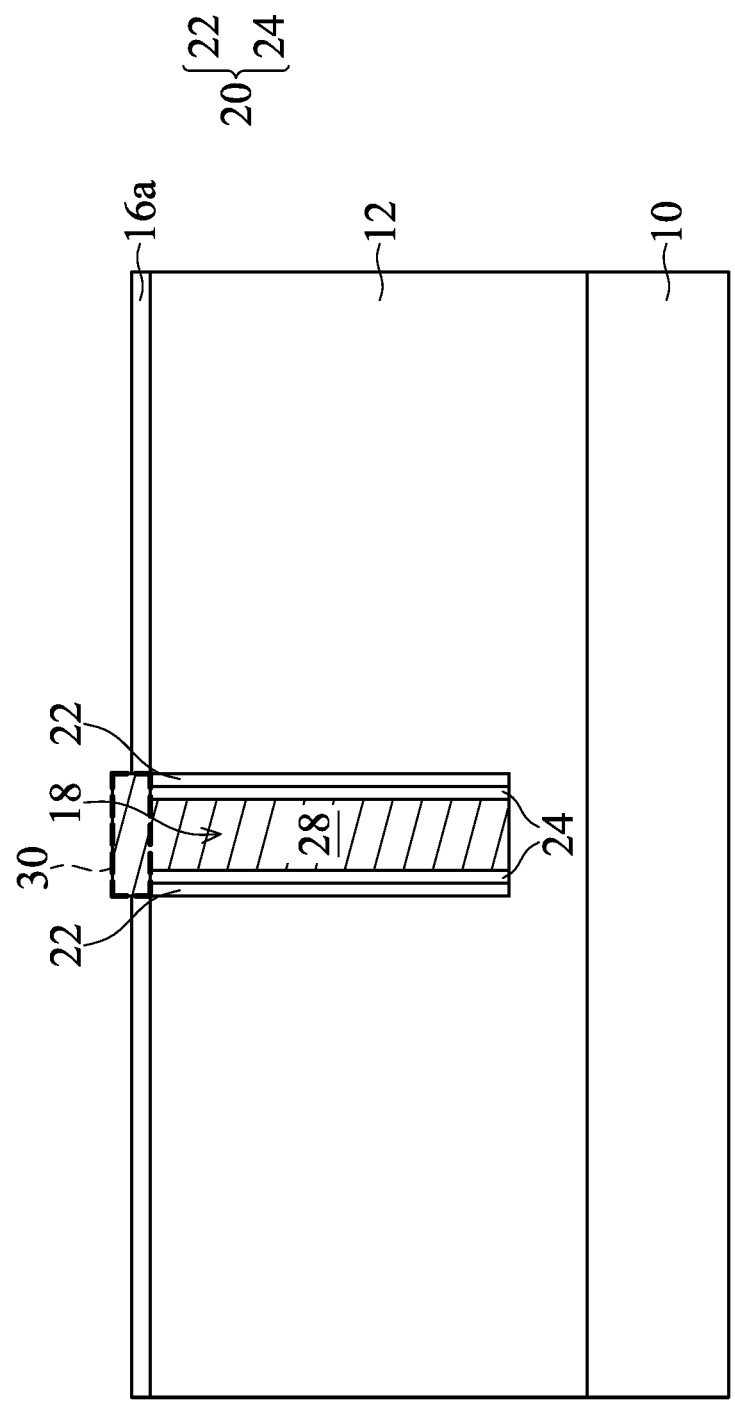
Figure 10:
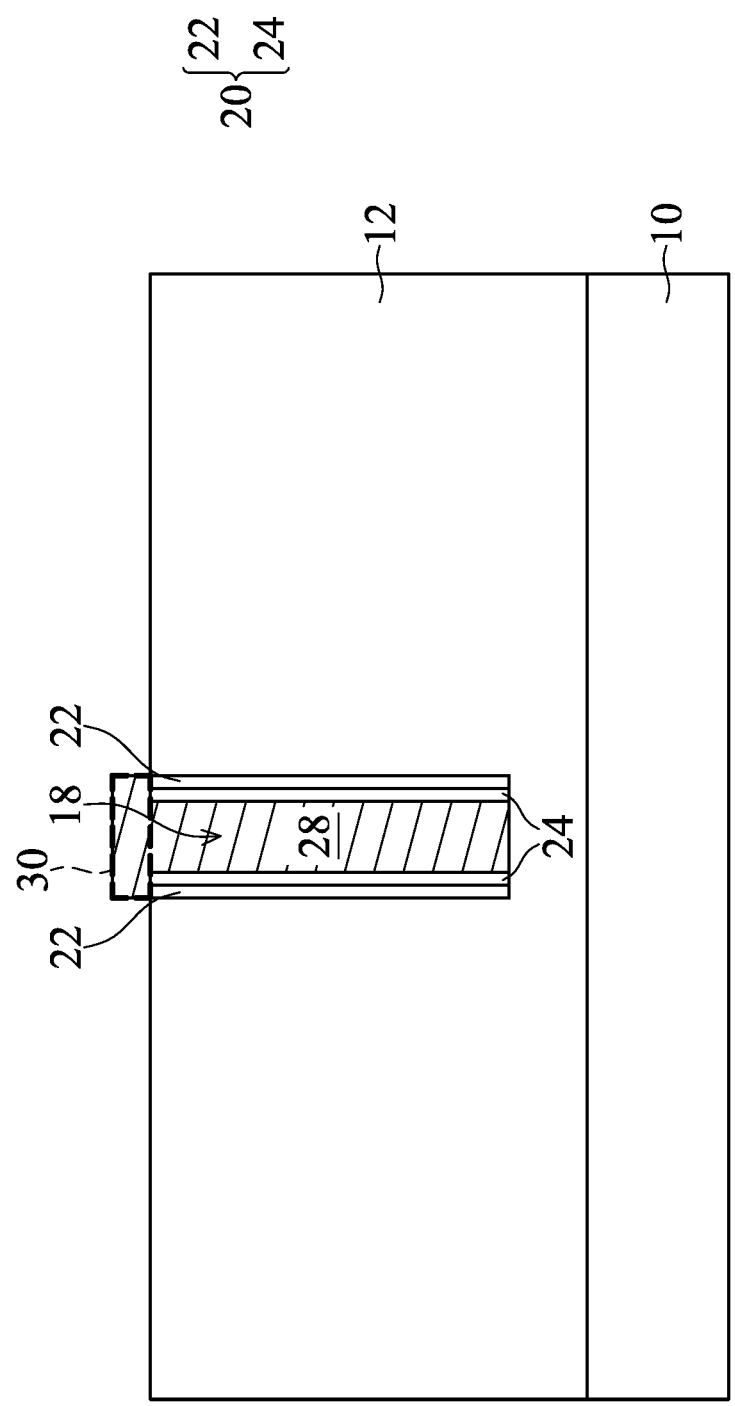

FIGS. 8-10 are cross-sectional views illustrating various steps in the removal of the mask structure 14 according to some embodiments of the present disclosure. The embodiments shown in FIGS. 8-10 are similar to the embodiments shown in FIGS. 1-7, wherein the main difference is the composition of the mask layer 14 and the steps of removing the mask layer 14. Thus, only FIGS. 8-10 are illustrated to describe the embodiments.

It should be noted that the reference numerals and partial description of the following embodiments are the same as the above embodiments, wherein the same or similar reference numerals are used to represent the same or similar elements, and the description of the same technical features are omitted. For the description of the omitted part, reference may be made to the above embodiments without being described again.

Referring to FIG. 8, in the embodiment, the mask structure 14 includes multiple dielectric layers. The mask structure 14 includes a first oxide layer 16a and a nitride layer 32a formed on the first oxide layer 16a. The thickness of the first oxide layer 16a is in a range from about 300 Å to about 700 Å. The thickness of the nitride layer 32a is in a range from about 400 Å to about 900 Å. The material of the first oxide layer 16a may be made of, or include, silicon dioxide or other suitable oxides. The nitride layer 32a may be made of, or include, silicon nitride or other suitable nitrides. In some embodiments, chemical vapor deposition (CVD), atomic layer deposition (ALD), or other similar processes may be used to form the nitride layer 32a. In the present embodiment, by disposing the first oxide layer 16a between the nitride layer 32a and the epitaxial layer 12, the problem of excessive stress arising from the direct contact between the nitride layer 32a and the epitaxial layer 12 can be solved.

It should be noted that, in the embodiments shown in FIGS. 8-10, before the step of forming the trench 18 (not shown), the thickness of the nitride layer 32a is in a range from about 2500 Å to about 3500 Å. Within the range of the thickness of the nitride layer 32a, after performing an etching process with the nitride layer 32a as an etching mask to form the trench 18, a portion of the nitride layer 32a and the complete first oxide layer 16a can remain. In other words, the thickness of the nitride layer 32a described above is sufficient to prevent components under the nitride layer 32a from damage. In some embodiments, the thickness of the remaining nitride layer 32a (e.g. the nitride layer 32a shown in FIG. 8) is in a range from about 400 Å to about 900 Å after forming the trench 18.

Referring to FIGS. 8-10, the mask structure 14 is removed after forming the trench 18 and the conductive feature 28. The removal of the mask structure 14 includes removing a portion of the mask structure 14 and without removing a layer of the multiple dielectric layers which is closest to the epitaxial layer 12, and removing the remaining mask structure 14 after removing the portion of the mask structure 14. In particular, the removal of the mask structure 14 includes removing the nitride layer 32a and remaining the first oxide layer 16a, and then removing the first oxide layer 16a.

In some embodiments, since the etching selection ratio of the nitride layer 32a is greater than that of the first oxide layer 16a, the first oxide layer 16a can remain completely after removing the nitride layer 32a. Then, after removing the nitride layer 32a, the first oxide layer 16a is subsequently removed.

It should be noted that when the thickness of the first oxide layer 16a is in a range from about 300 Å to about 700 Å, an etching process with a short cycle time (e.g. about 10 seconds to about 30 seconds) may be performed to completely remove the first oxide layer 16a, in the embodiment. This etching process can remove the first oxide layer 16a completely and precisely, so the elements around the first oxide layer 16a may be undamaged by this etching process. In particular, the short cycle time of the etching process, which is between about 10 and 30 seconds, means that the etching process can be performed to completely remove the first oxide layer 16a and prevent over etching from damaging the diffusion barrier layer 20. Furthermore, the diffusion barrier layer 20 can remain intact and the dopant diffusion from the conductive feature 28 can be blocked effectively, and thereby the electrical properties of the peripheral elements may not be impacted.

In a specific embodiment, an etching process with hot phosphoric acid as an etchant may be performed on the nitride layer 32a for about 50 seconds to about 100 seconds to completely remove the nitride layer 32a. Subsequently, an etching process with hydrofluoric acid as an etchant is performed on the first oxide layer 16a for about 50 seconds to about 100 seconds to completely remove the first oxide layer 16a.

Figure 11:
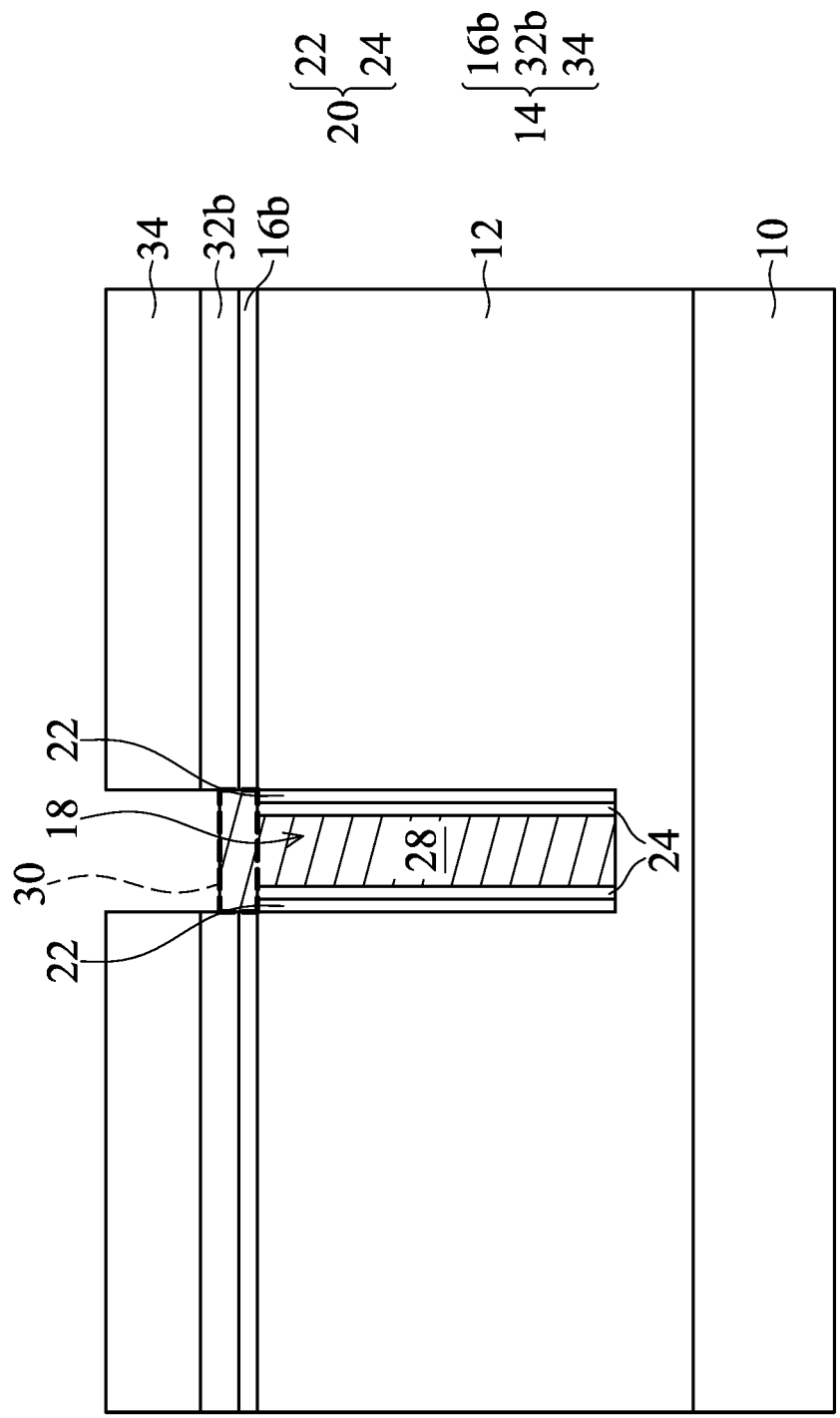
Figure 12:
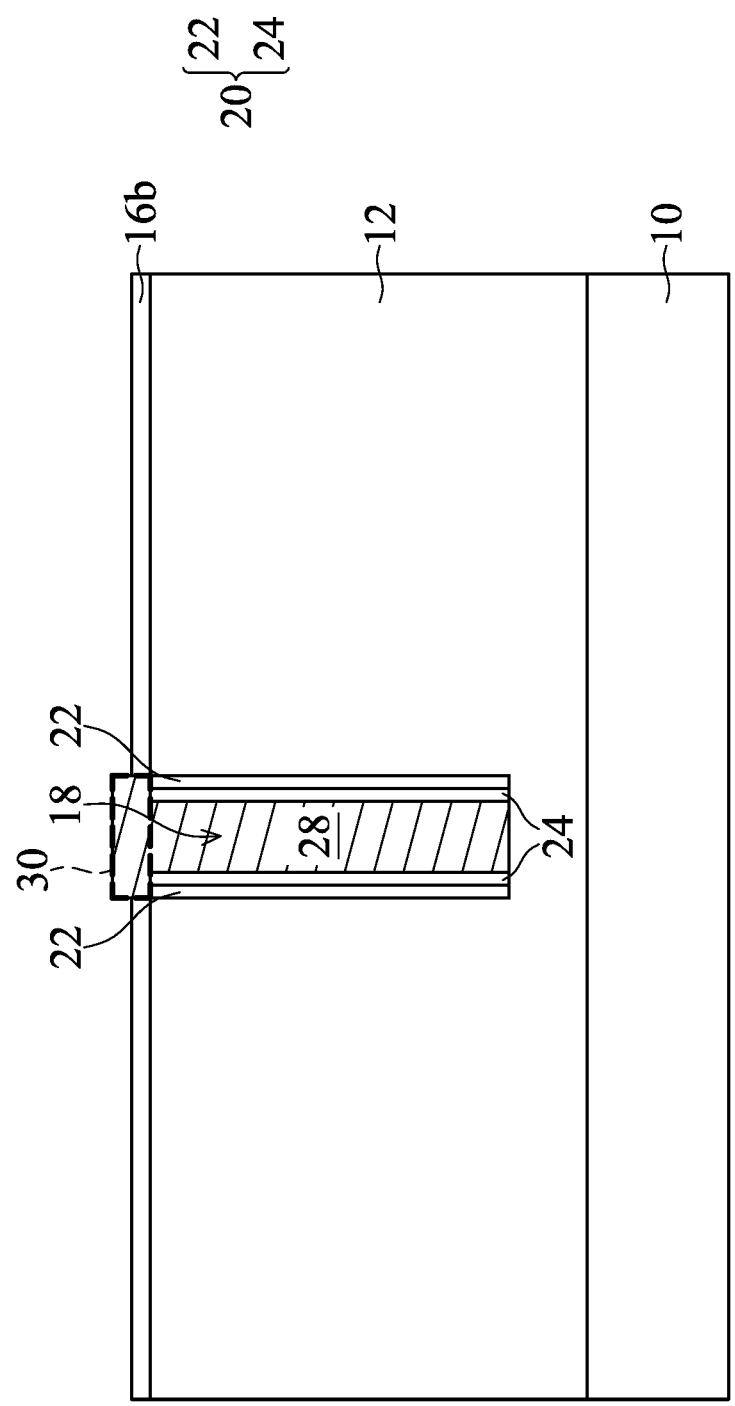
Figure 13:
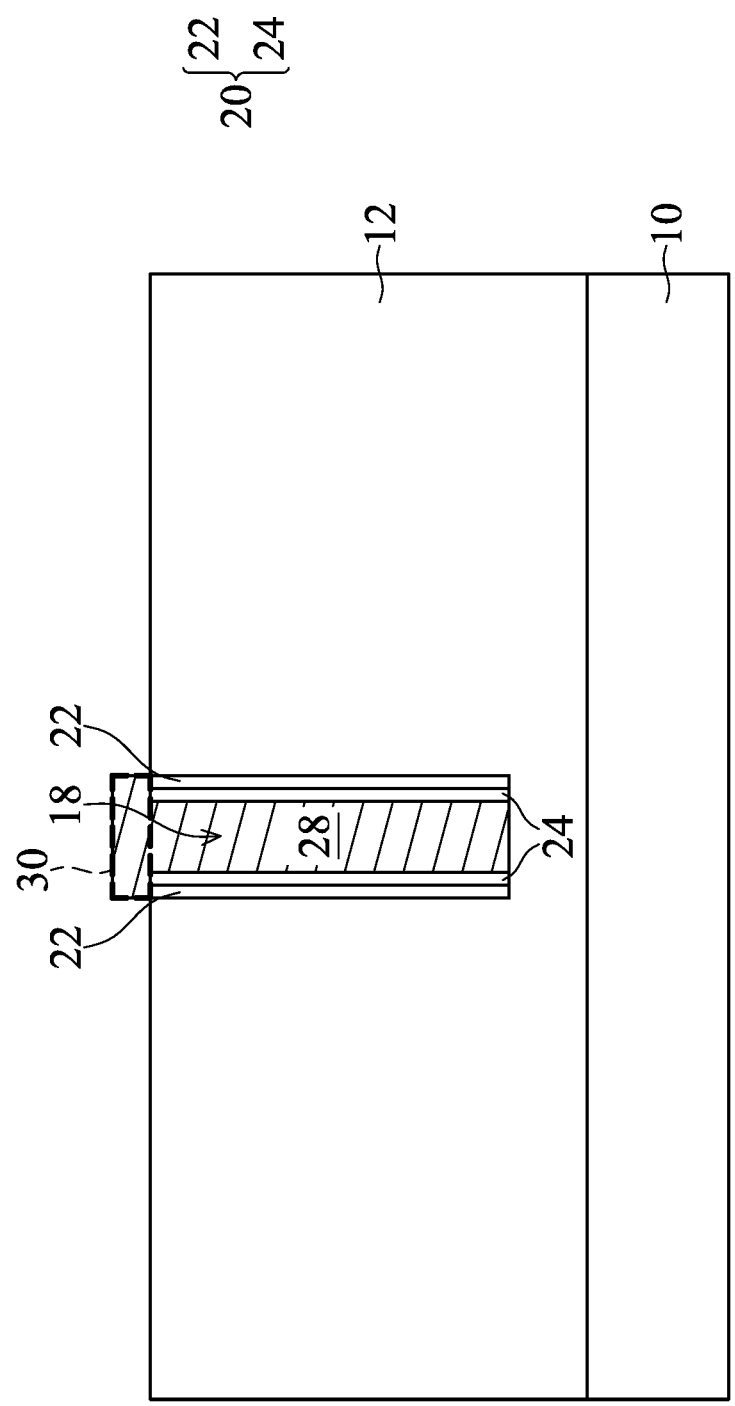

FIGS. 11-13 illustrate various steps in the removal of the mask structure 14 according to some other embodiments of the present disclosure. The embodiments shown in FIGS. 11-13 are similar to the embodiments shown in FIGS. 1-7, wherein the main difference is the composition of the mask layer 14 and the steps of removing the mask layer 14. Thus, only FIGS. 11-13 are illustrated to describe the embodiments.

Referring to FIG. 11, in some other embodiments, the mask structure 14 includes a first oxide layer 16b, a nitride layer 32b formed on the first oxide layer 16b, and a second oxide layer 34 formed on the nitride layer 32b. The thickness of the first oxide layer 16b is in a range from about 300 Å to about 700 Å. The thickness of the nitride layer 32b is in a range from about 900 Å to about 1300 Å. The thickness of the second oxide layer 34 is in a range from about 2000 Å to about 4000 Å. The material of the first oxide layer 16b may be made of, or include, silicon dioxide or other suitable oxides. The nitride layer 32b may be made of, or include, silicon nitride or other suitable nitrides. The material of the second oxide layer 34 may be made of, or include, silicon dioxide or other suitable oxides. In the present embodiment, by disposing the first oxide layer 16b between the nitride layer 32b and the epitaxial layer 12, the problem of excessive stress arising from the direct contact between the nitride layer 32b and the epitaxial layer 12 can be solved.

It should be noted that, in the embodiments shown in FIGS. 11-13, before the step of forming the trench 18 (not shown), the thickness of the second oxide layer 34 is in a range from about 2500 Å to about 3300 Å. Within the range of the thickness of the second oxide layer 34, after performing an etching process with the second oxide layer 34 as an etching mask to form the trench 18, a portion of the second oxide layer 34, the complete nitride layer 32b, and the complete first oxide layer 16b can remain. In other words, the thickness of the second oxide layer 34 described above is sufficient to protect components under the second oxide layer 34 from damage. In some embodiments, the thickness of the remaining second oxide layer 34 (e.g. the second oxide layer 34 shown in FIG. 11) is in a range from about 400 Å to about 900 Å after forming the trench 18.

Referring to FIGS. 11-13, the mask structure 14 is removed after forming the trench 18 and the conductive feature 28. The removal of the mask structure 14 includes removing a portion of the mask structure 14 and without removing a layer of the multiple dielectric layers which is closest to the epitaxial layer 12, and removing the remaining mask structure 14 after removing the portion of the mask structure 14. In particular, the removal of the mask structure 14 includes removing the nitride layer 32b and the second oxide layer 34 first, and then removing the first oxide layer 16b.

In some embodiments, the height of the top surface of the protruding portion 30 is between the top surface and the bottom surface of the nitride layer 32b. Thus, when performing a wet etching to remove the nitride layer 32b, the second oxide layer 34 on the nitride layer 32b may be removed simultaneously. In addition, in some embodiments, since the etching selection ratio of the nitride layer 32b is greater than that of the first oxide layer 16b, the first oxide layer 16b can remain completely after removing the nitride layer 32b.

Then, after removing the second oxide layer 34 and the nitride layer 32b, the first oxide layer 16b is subsequently removed. It should be noted that in the embodiment that the thickness of the first oxide layer 16b is in a range from about 300 Å to about 700 Å, an etching process with a short cycle time (e.g. about 10 seconds to about 30 seconds) may be performed to completely remove the first oxide layer 16b. This etching process can remove the first oxide layer 16b completely and precisely, so the elements around the first oxide layer 16b may remain undamaged by this etching process. In particular, the short cycle time of the etching process, which is between about 10 and 30 seconds, means that the etching process can be performed to completely remove the first oxide layer 16b and prevent over etching from damaging the diffusion barrier layer 20. Furthermore, the diffusion barrier layer 20 can remain intact and the dopant diffusion from the conductive feature 28 to the periphery can be blocked effectively, and thereby the electrical properties of the peripheral elements may not be impacted.

In a specific embodiment, an etching process with hot phosphoric acid as an etchant may be performed on the nitride layer 32b and the second oxide layer 34 for about 50 seconds to about 100 seconds to completely remove the nitride layer 32a and the second oxide layer 34. Subsequently, an etching process with hydrofluoric acid as an etchant is performed on the first oxide layer 16b for about 50 seconds to about 100 seconds to completely remove the first oxide layer 16b.

In some other embodiments, the second oxide layer 34, the nitride layer 32b, and the first oxide layer 16b may be removed in sequence. For example, the hydrofluoric acid is used to remove the second oxide layer 34, the hot phosphoric acid is used to remove the nitride layer 32b, and then the hydrofluoric acid is used to remove the first oxide layer 16b.

Referring to FIG. 14, a contact doped region 36 may be formed in the epitaxial layer 12, wherein the contact doped region 36 is adjacent to the substrate 10 and contacts the conductive feature 28 so that the current can flow between the conductive feature 28 and the contact doped region 36. The contact doped region 36 may be P-type. In an embodiment, a first well region 38 may be formed in the epitaxial layer 12, wherein the first well region 38 surrounds a portion of the conductive feature 28 which is near the upper surface of the epitaxial layer 12. The first well region 38 may be P-type. In some embodiments, a second well region 42 may be formed in the epitaxial layer 12 on opposite sides of the first well region 38. The second well region 42 may be N-type.

Referring to FIG. 15, two gate structures 46 may be formed on the epitaxial layer 12, wherein the gate structures 46 are disposed between the first well region 38 and the adjacent second well region 42. In some embodiments, the gate structures 46 may include a gate dielectric layer 48, a gate electrode 50 disposed on the gate dielectric layer 48, and a gate silicide layer 52 disposed on the gate electrode 50. The gate dielectric layer 48 may be silicon oxide, silicon nitride, silicon oxynitride, a high-k dielectric material, other suitable dielectric materials, or a combination thereof. The high-k dielectric material may be metal oxide, metal nitride, metal silicide, transition metal oxide, transition metal nitride, transition metal silicide, metal oxynitride, metal alluminates, zirconium silicates, or zirconium alluminates. The gate electrode 50 may be metal, metal nitride, conductive metal oxide, or a combination thereof. The metal mentioned above may include but not be limited to molybdenum, tungsten, titanium, tantalum, platinum, or hafnium. The gate silicide layer 52 may be made of, or include, nickel silicide, cobalt silicide, titanium silicide, or a combination thereof. In an embodiment, the gate structures 46 may only include the gate dielectric layer 48 and the gate electrode 50.

In addition, a source region 40 may be formed in the first well region 38, wherein the source region 40 surrounds a portion of the conductive feature 28 which is near the upper surface of the epitaxial layer 12. In the present embodiment, the diffusion barrier layer 20 contacts the source region 40 and separates the source region 40 from the conductive feature 28. Thus, the diffusion barrier layer 20 can block the dopants of the conductive feature 28 diffusing to the source region 40 which further prevents the electrical properties of the source region 40 from being impacted. The source region 40 may be N-type. In some embodiments, a drain region 44 may be formed in the second well region 42. The drain region 42 may be heavily-doped N-type.

In some embodiments, a gate spacer 54 may be formed on sidewalls of the gate structure 46, and an insulating layer 55 may be formed on the upper surface of the gate structure 46, a surface of the gate spacer 54, and the upper surface of the epitaxial layer 12, wherein the insulating layer 55 exposes the conductive feature 28, the source region 40, and the drain region 44.

In some embodiments, a conductive layer 56 may be formed on the epitaxial layer 12. The conductive layer 56 covers the conductive feature 28, the source region 40, the gate structure 46, and a portion of the second well region 42, and exposes the drain region 44. In some embodiments, an interlayer dielectric layer 58 may be formed on the epitaxial layer 12, and a contact plug 60 may be formed to penetrate the interlayer dielectric layer 58 and connect the drain region 44. The contact plug 60 may include polysilicon, aluminum, gold, cobalt, copper, similar materials, or a combination thereof. Then, a conductive feature 62 may be formed on the interlayer dielectric layer 58 and electrically connect the contact plug 60. The conductive feature 62 may include copper, gold, tin, similar materials, or a combination thereof.

A semiconductor structure 100 shown in FIG. 15 may be achieved by the steps in one or more described embodiments. It should be noted that, in the embodiment shown in FIG. 15, the right portion (including the source region 40) and the left portion (including the source region 40) of the semiconductor structure 100 with the source region 40 as the reference line are individual laterally diffused metal oxide semiconductors (LDMOSs). In the present embodiment, the source region 40 may serve as a common source region of the two LDMOSs. The conductive feature 28 is formed between the two LDMOSs and penetrates the common source region of the LDMOSs, and the conductive feature 28 electronically connects the source region 40 by the conductive layer 56. Thus, the two LDMOSs transfer current through the same source region 40 and the same conductive feature 28, so the goal of saving space and reducing the manufacturing cost can be achieved.

In summary, the semiconductor structure in the embodiments of the present disclosure has a diffusion barrier layer disposed between a conductive feature and an epitaxial layer. Thus, the diffusion barrier layer can block the dopant diffusion from the conductive feature to the periphery during subsequent processes (e.g. a high-temperature thermal process) which further prevents the electrical properties of peripheral elements from being impacted. Furthermore, the scaling down of the LDMOS is not limited and the source-drain resistance ($R_{DSON}$) can be reduced further to enhance the performance of the LDMOS.

In addition, when the height of the top surface of the conductive feature is lower than or the same as the height of the top surface of the epitaxial layer, a seam in the conductive feature penetrates the top surface of the conductive feature to cause erosion in subsequent cleaning steps, so short-circuits and other problems may subsequently arise. Thus, the conductive feature of the semiconductor structure in the embodiments of the present disclosure that has a protruding portion that is higher than the epitaxial layer can prevent the seam in the conductive feature from penetrating the top surface of the conductive feature and further prevent problems from arising in subsequent manufacturing processes.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
    a substrate;
    an epitaxial layer disposed on the substrate;
    a conductive feature disposed in the epitaxial layer and having a protruding portion that is higher than the epitaxial layer;
    a diffusion barrier layer disposed on sidewalls of the conductive feature, wherein the diffusion barrier layer comprises a barrier oxide layer, wherein a bottom surface of the conductive feature is in direct contact with the epitaxial layer; and
    a source region disposed in the epitaxial layer, wherein the diffusion barrier layer contacts the source region and separates the source region from the conductive feature.

2. The semiconductor structure as claimed in claim 1, wherein a width of the protruding portion is greater than a width of the conductive feature in the epitaxial layer.

3. The semiconductor structure as claimed in claim 1, wherein the protruding portion covers a top surface of the diffusion barrier layer.

4. The semiconductor structure as claimed in claim 1, wherein the diffusion barrier layer comprises one or more than one dielectric barrier layers.

5. The semiconductor structure as claimed in claim 4, wherein the diffusion barrier layer further comprises a barrier nitride layer on the barrier oxide layer.

6. The semiconductor structure as claimed in claim 1, wherein the conductive feature is disposed between two laterally diffused metal oxide semiconductors (LDMOSs) and the conductive feature penetrates a common source region of the LDMOSs, wherein each of the two laterally diffused metal oxide semiconductors comprises a gate structure disposed between a drain region and the common source region.

7. The semiconductor structure as claimed in claim 6, further comprising:
    an insulating layer disposed on an upper surface of the gate structure and the epitaxial layer, wherein the insulating layer exposes the conductive feature, the common source region, and a portion of the drain region; and a conductive layer disposed continuously on the upper surface of the gate structure, the common source region, and the conductive feature.

8. A method for fabricating a semiconductor structure, comprising:

providing a substrate;

forming an epitaxial layer on the substrate;

forming a mask structure on the epitaxial layer, and the mask structure has an opening exposing a portion of the epitaxial layer;

using the mask structure as an etching mask to remove the exposed portion of the epitaxial layer to form a trench;

forming a diffusion barrier layer conformally in the trench, wherein the diffusion barrier layer comprises a barrier oxide layer;

removing a portion of the diffusion barrier layer on a bottom surface of the trench;

forming a conductive feature in the trench, wherein the conductive feature has a protruding portion that is higher than the epitaxial layer; and removing the mask structure.

9. The method as claimed in claim 8, wherein a width of the protruding portion is greater than a width of the conductive feature in the trench.

10. The method as claimed in claim 8, wherein the protruding portion covers a top surface of the diffusion barrier layer.

11. The method as claimed in claim 8, wherein the mask structure comprises one or more than one dielectric layers.

12. The method as claimed in claim 11, wherein the mask structure comprises a first oxide layer and a nitride layer formed on the first oxide layer.

13. The method as claimed in claim 12, wherein the mask structure further comprises a second oxide layer formed on the nitride layer.

14. The method as claimed in claim 11, wherein the mask structure comprises multiple dielectric layers, and removing the mask structure comprises:

removing a portion of the mask structure without removing a layer of the multiple dielectric layers which is closest to the epitaxial layer; and after removing the portion of the mask structure, removing remaining of the mask structure.

15. The method as claimed in claim 8, wherein the diffusion barrier layer comprises one or more than one dielectric barrier layers.

16. The method as claimed in claim 15, wherein the diffusion barrier layer further comprises a barrier nitride layer formed on the barrier oxide layer.

17. The method as claimed in claim 8, further comprising forming a drain region in the epitaxial layer, wherein the diffusion barrier layer contacts the drain region and separates the drain region from the conductive feature.

18. The method as claimed in claim 8, wherein the conductive feature is formed between two laterally diffused metal oxide semiconductors (LDMOSs) and the conductive feature penetrates a common source region of the LDMOSs.

* * * * *